(12) United States Patent
Ramakrishnan

(10) Patent No.: US 6,249,466 B1
(45) Date of Patent: Jun. 19, 2001

(54) ROW REDUNDANCY SCHEME (75) Inventor: Purushothaman Ramakrishnan, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/534,412

(22) Filed: Mar. 23, 2000

(51) Int. Cl.$^7$ ...................................................... G11C 7/00
(52) U.S. Cl. ........................ 365/200; 365/195; 365/230.03
(58) Field of Search .................................. 365/200, 195, 365/230.03, 230.06, 189.01, 230.01

(56) References Cited

U.S. PATENT DOCUMENTS

| | | | |
|---|---|---|---|
| 5,359,560 | * 10/1994 | Suh et al. | 365/200 |
| 5,394,369 | * 2/1995 | Kagami | 365/200 |
| 5,544,106 | * 8/1996 | Koike | 365/200 |
| 5,903,575 | * 5/1999 | Kikuda | 371/21.2 |
| 6,078,543 | * 6/2000 | Kim | 365/230.03 |

* cited by examiner

*Primary Examiner*—David Nelms
*Assistant Examiner*—Hoai V. Ho
(74) *Attorney, Agent, or Firm*—Christopher P. Maiorana, P.C.

(57) ABSTRACT

A circuit comprising a memory array, a driver circuit, and a logic circuit. The memory array may have a plurality of memory cells arranged in a plurality of rows. Each cell may be configured to read and write data. The driver circuit may be configured to present a plurality of word line signals in response to a decoded row signal and a disable signal. The logic circuit may be configured to generate the disable signal in response to (i) one or more programmed redundant row signals and (ii) a decoded group signal.

20 Claims, 7 Drawing Sheets

FIG. 1
(CONVENTIONAL)

ROW REDUNDANCY SCHEME

FIELD OF THE INVENTION

The present invention relates to a method and/or architecture for row redundancy generally and, more particularly, to a row redundancy method and/or architecture that may be implemented with a minimum of silicon area.

BACKGROUND OF THE INVENTION

Conventional memory block architectures implement memory cells arranged in rows and columns to form one or more arrays. Furthermore, the columns of the array are divided into groups of columns. A particular cell of the memory block is written to or read from by selecting the appropriate (i) row, (ii) group and (iii) column within the group. Conventional memory arrays use redundant memory cells and wordlines to compensate for production errors.

The redundant memory cells are also arranged in rows (e.g., redundant rows) and columns (e.g., redundant columns) to form arrays. After the production of a complete memory array, a post production test of the memory array is generally performed. If the post-production testing indicates that one or more cells of the memory array are defective, redundant memory cells can be substituted.

The substitution typically occurs after the entire memory array has been manufactured. If one or more cells in a row are defective, the entire row is replaced by a redundant row. Similarly, if one or more cells in a column are defective, then the entire column is replaced by a redundant column. Replacement of a defective cell by a single redundant cell is not common, because of high overhead associated with such a scheme. By allowing the defective memory cells to be replaced by the redundant cells after production, the memory array can still be used. Conventional approaches to disable a faulty row or column use one or more fuses to disable the faulty portion(s). It is desirable to provide a method and/or architecture for row redundancy that may not require additional disable fuses.

Figure 1:
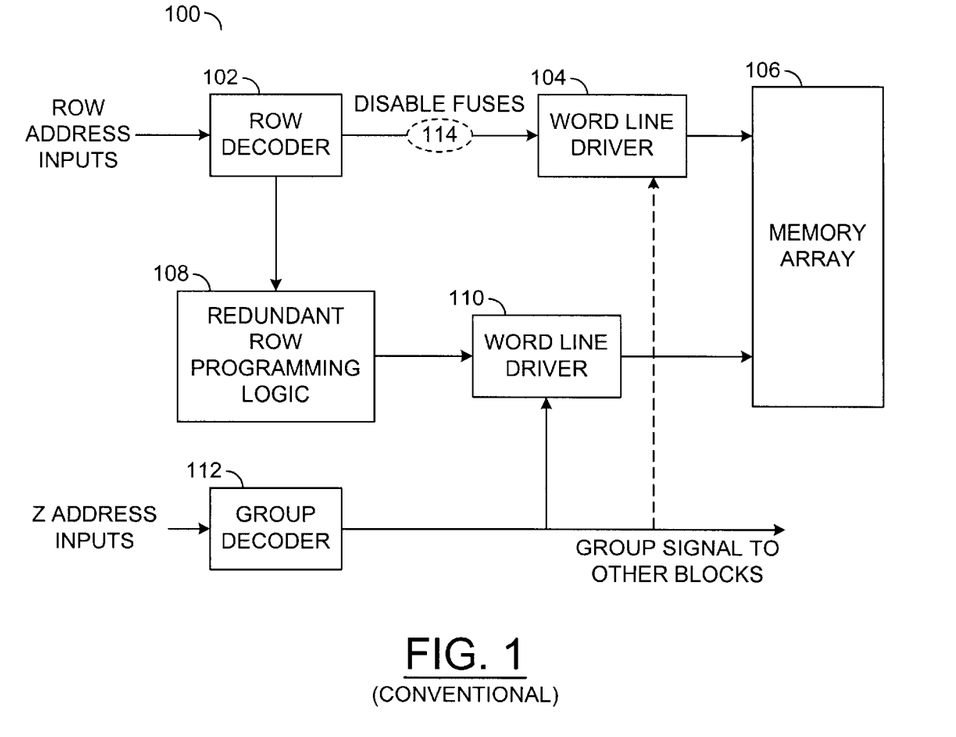
FIG. 1 is a block diagram of a conventional circuit for row redundancy.

Referring to FIG. 1, a circuit 100 is shown implementing a conventional row redundancy scheme. The circuit 100 generally comprises a row decoder 102, a word line driver 104, a memory array 106, a redundant row programming logic 108, a word line driver 110, a group decoder 112 and a fuse block 114. The word line driver 104 is implemented to select a regular row. The word line driver 110 is implemented to select a redundant row. The group decoder 112 is implemented to select a group of the memory array 106. The fuse block 114 is configured to disable faulty rows of the memory array 106. Each regular row has a disable fuse (e.g., fuse block 114). If the memory array 106 comprises 'n' rows, then 'n' disable fuses are required (where n is an integer). If a particular row is faulty, the respective disable fuse is blown using a laser (not shown). The disabled fuse prevents the faulty row from being written to and/or read from. The fuse block 114 consumes a large amount of die area. For example, a single Meg SRAM 106 has 1000 disabling fuses if the memory cells are arrayed into 1000 rows and 1000 columns. In another example, a single Meg SRAM 106 has 2000 disabling fuses if the memory cells are arrayed into 2000 rows and 500 columns. The conventional approach of FIG. 1 consumes a large amount of die area for the disabling fuses (fuse block 114), even if no redundancy is required.

SUMMARY OF THE INVENTION

The present invention concerns a circuit comprising a memory array, a driver circuit, and a logic circuit. The memory array may have a plurality of memory cells arranged in a plurality of rows. Each cell may be configured to read and write data. The driver circuit may be configured to present a plurality of word line signals in response to a decoded row signal and a disable signal. The logic circuit may be configured to generate the disable signal in response to (i) one or more programmed redundant row signals and (ii) a decoded group signal.

The objects, features and advantages of the present invention include providing a method and/or architecture that may provide row redundancy (i) without the requirement of disabling fuses and/or (ii) using a minimum amount of die area.

BRIEF DESCRIPTION OF THE DRAWINGS

These and other objects, features and advantages of the present invention will be apparent from the following detailed description and t appended claims and drawings in which:

DETAILED DESCRIPTION OF THE PREFERRED EMBODIMENTS

Figure 2:
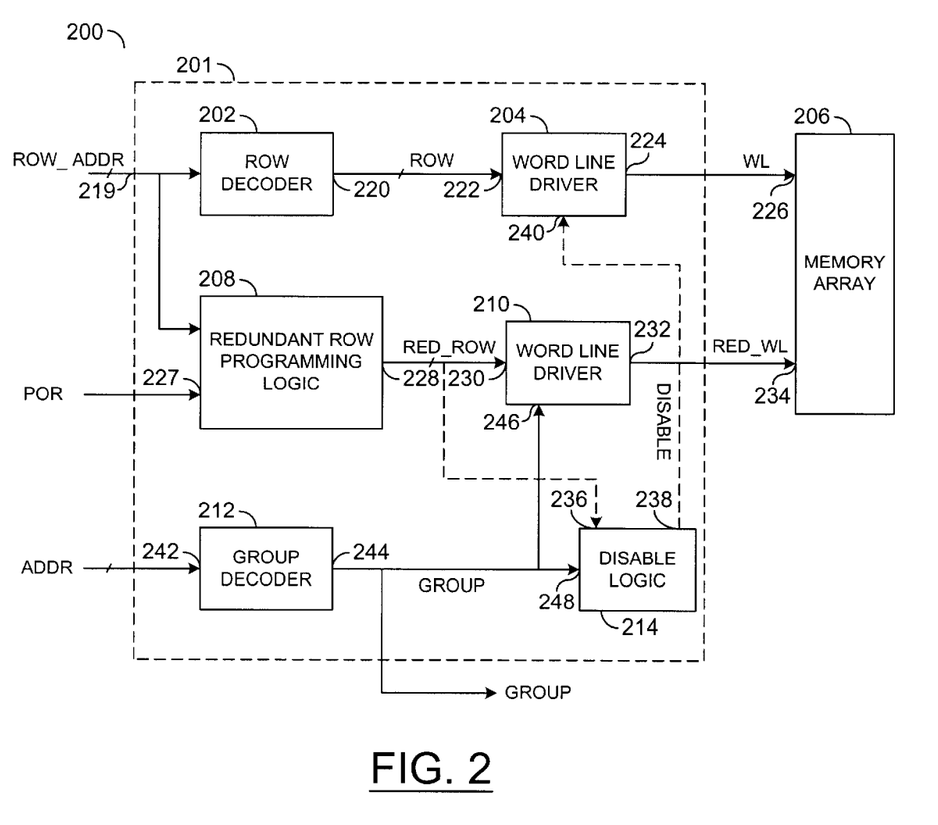
FIG. 2 is a block diagram of a preferred embodiment of the present invention.

Referring to FIG. 2, a block diagram of a circuit 200 is shown in accordance with a preferred embodiment of the present invention. The circuit 200 may implement row redundancy in a memory without requiring a plurality of fuses to disable one or more word lines. The circuit 200 generally comprises a row logic block (or circuit) 201 and a memory 206. The row logic block 201 generally comprises a row decoder 202, a word line driver 204, a redundant row programming logic block (or circuit) 208, a word line driver 210, a group decoder block (or circuit) 212 and a disable logic block (or circuit) 214. The word line driver 204 may be implemented to select a regular row. The redundant row programming logic circuit 208 and the word line driver 210 may be implemented to select a redundant word. The group decoder circuit 212 may be implemented to select a group.

The row logic block 201 may have an input 219 that may receive a signal (e.g., a row address $ROW_{13}ADDR$). The signal $ROW_{13}ADDR$ may be presented to the row decoder 202 and the redundant row programming logic circuit 208. The signal $ROW_{13}ADDR$ may be implemented as, in one example, a n bit wide signal, where n is an integer. The row decoder 202 may have an output 220 that may be $2^n$ bits wide, where $2^n$ corresponds to a number of physical rows (e.g., excluding redundant rows) in the memory array 206.

Each of the physical rows are generally divided into y logic rows, where y corresponds to the number of groups in the memory array 206. The row logic block 201 may receive the row address inputs ($ROW_{13}ADDR$) and for a given n bit row address input ROW₁₃ADDR, the row decoder 202 may select one of the 2ⁿ physical rows of the memory 206 to read from or write to. The row decoder 202 may be implemented as a single stage decoder (to be discussed in connection with FIG. 3) or multistage decoder (to be discussed in connection with FIG. 4).

The row decoder 202 may have an output 220 that may present a signal (e.g., ROW) to an input 222 of the word line driver 204. The word line driver 204 may have an output 224 that may present a signal (e.g., WL) to an input 226 of the memory array 206. The redundant row programming logic circuit 208 may have an input 227 that may receive a signal (e.g., POR) and an output 228 that may present a signal (e.g., RED_ROW). The signal RED_ROW may be presented to an input 230 of the word line driver 210 and an input 236 of the disable logic circuit 214. Additionally, the word line driver 210 may have an input 246 that may receive a signal (e.g., GROUP). The word line driver 210 may have an output 232 that may present a signal (e.g., RED_WL) to an input 234 of the memory array 206.

The group decoder 212 may have an input 242 that may receive a signal (e.g., ADDR). The signal ADDR may be implemented, in one example, as a n bit wide signal, where n is an integer. Additionally, the group decoder 212 may have an output 244 that may present the signal GROUP. The signal GROUP may be y bits wide, where y corresponds to the number of groups in the memory array 206. The group decoder circuit 212 may be implemented as a single stage decoder (to be discussed in connection with FIG. 3) or as a multistage decoder (to be discussed in connection with FIG. 4).

The redundant row programming logic circuit 208 may have an input 219 that may be n bits wide and an output 228 that may be m bits wide, where n and m are integers and m corresponds to the number of physical redundant rows in the memory array 206. The redundant row programming logic block 208 may be configured to map any of the output signals (i.e., any of the redundant rows) to any combination of the row address inputs. The redundant row programming logic block 208 may provide mapping for a single redundant row and 8-bit address (to be discussed in connection with FIG. 5).

The disable logic block 214 may have an input 248 that may receive the signal GROUP. The disable logic block 214 may have an output 238 that may present a signal (e.g., DISABLE) to an input 240 of the word line driver 204.

Figure 3:
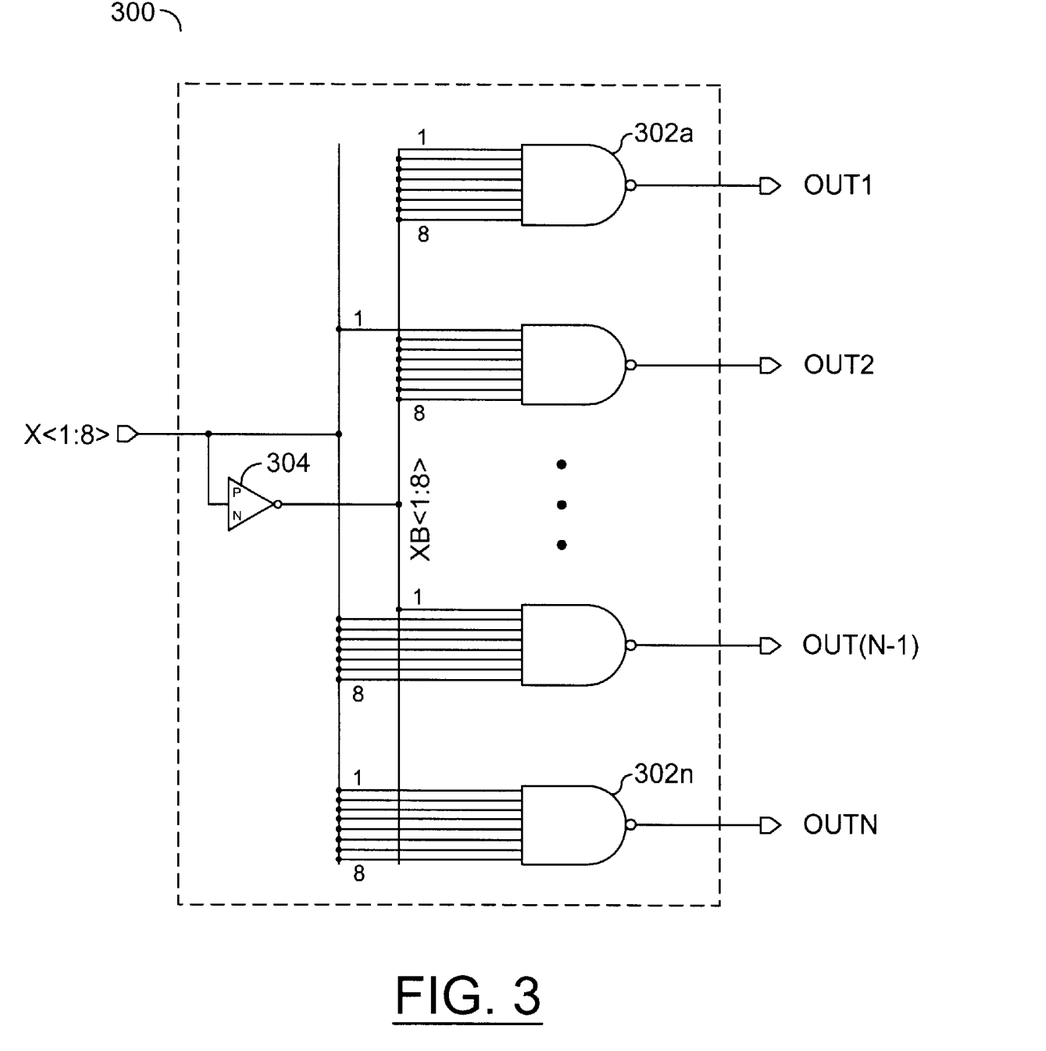
FIG. 3 is a block diagram of a decoder of FIG. 2.

Referring to FIG. 3, a detailed block diagram of a single stage 8 to 256 decoder 300 is shown. The single stage decoder 300 may be implemented as the row decoder block 202 and/or the group decoder 212. The decoder 300 generally comprises a number of gates 302a–302n and a number of inverters 304n. The particular number of inverters 304n generally matches the bit width of the signal ROW₁₃ADDR. The gates 302a–302n may be implemented as, in one example, NAND gates. However, the particular implementation and polarities of the gates 302a–302n may be varied accordingly to meet the design criteria of a particular application. Since each NAND gate 302a–302n generally corresponds to one row of cells, one dimension of the layout of the NAND gates 302a–302n may match the corresponding dimension of the layout of the memory cell. Since it is difficult to match the pitch of the 8-input NAND gates 302a–302n with that of the memory cell and the propagation delay involved in an 8-input NAND gate is high, a multiple stage decoder (to be discussed in connection with in FIG. 4) is generally used for decoding when a number of inputs is more than four.

Figure 4:
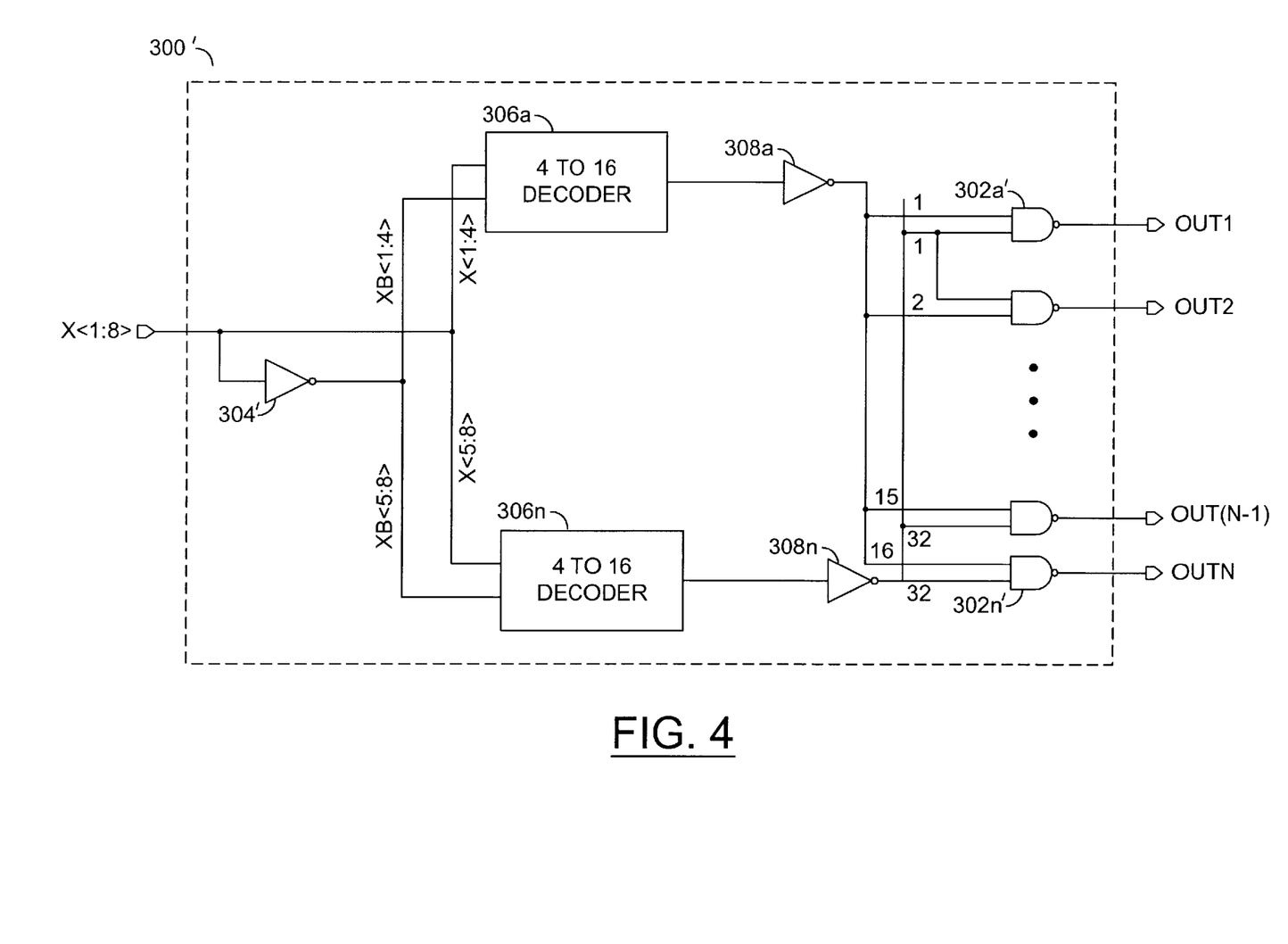
FIG. 4 is a detailed block diagram of an alternate decoder of FIG. 2.

Referring to FIG. 4, a detailed block diagram of a multistage 8 to 256 decoder 300' is shown. The multistage decoder 300' is similar to the single stage decoder 300, marked with primed notation. The multistage decoder 300' may additionally comprise a number of 4 to 16 decoders 306a–306n and a number of inverters 308a–308n. Each of the inverters 308a–308n may be implemented as a number of inverters that generally corresponds to the bit width of the outputs of the decoders 306a–306n. The multistage decoder 300' may implement a final gate (gates 302a–302n) as a 2-input NAND gate. A 2-input NAND gate 302a'–302n' may be pitched with the memory cells to provide compensation for propagation delay.

Figure 5:
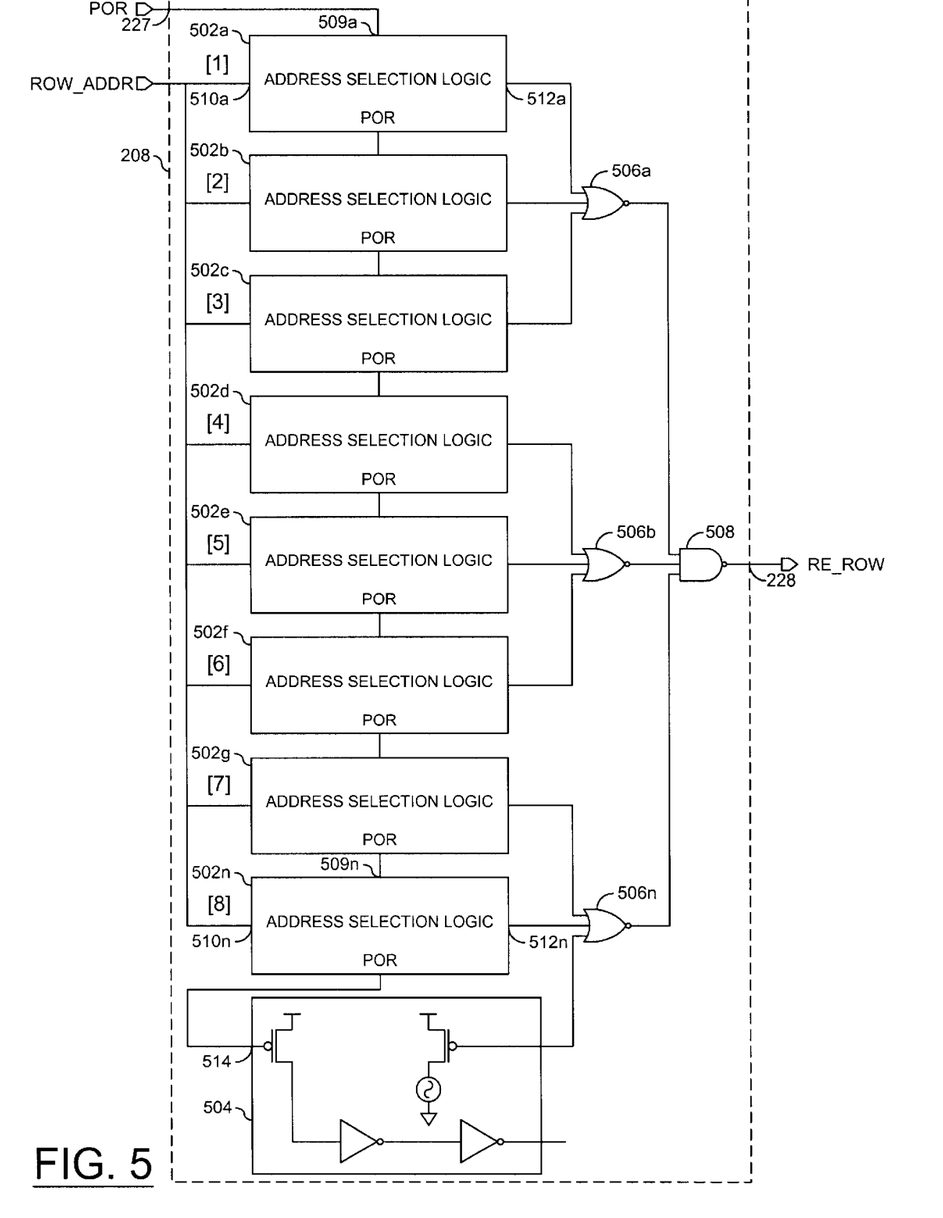
FIG. 5 is a block diagram of a redundant row programming logic block of FIG. 2.

Referring to FIG. 5, a more detailed diagram of the redundant row programming logic block 208 is shown. The redundant row programming logic block 208 is shown comprising a number of logic blocks (or circuits) 502a–502n, a fuse logic block 504, a number of gates 506a–506n and a gate 508. The gates 506a–506n may be implemented, in one example, as NOR gates. The gate 508 may be implemented, in one example, as a NAND gate. The particular implementation and polarities of the gates 506a–506n and the gate 508 may be varied accordingly to meet the design criteria of a particular application. Additionally, the logic blocks 502a–502n may be implemented as, in one example, address selection logic blocks.

If the redundant row programming logic block 208 is to be programmed for '00000000', a programming fuse would not generally be blown in any of the logic blocks 502a–502n (e.g., by default the redundant row programming logic 208 is programmed for the address '00000000'). Unless a programming fuse (to be discussed in connection with FIG. 6) in the fuse logic block 504 is blown, the NOR gate 506n is not enabled. Even if the address '00000000' is presented at the input of the redundant row programming block 208, the redundant row programming logic block 208 may not be enabled. So if a redundant row is to be programmed, a minimum of one disable fuse is required (the one in the fuse logic 504 is generally blown). If the redundant row is to be programmed for the address '11111111', the disable fuses in all the address selection logic blocks 502a–502n and in the fuse logic block 504 are generally blown. The redundant row programming logic block 208 and the row decoder 202 generally receive the same row address inputs (ROW₁₃ADDR). The conventional circuit 100 generally provides row address inputs from an output of an intermediate stage of the multistage regular row decoder to save area.

Figure 6:
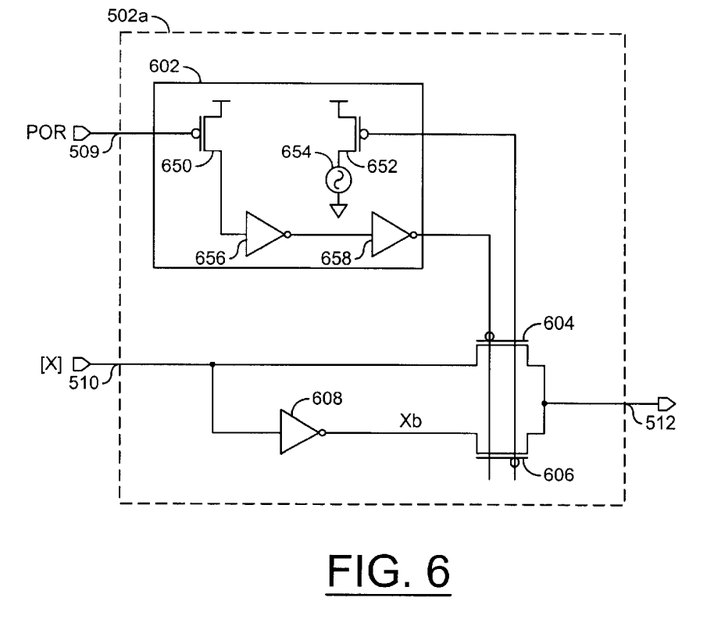
FIG. 6 is a block diagram of an address selection block of FIG. 5.

Referring to FIG. 6, a schematic of the address selection logic block 502a is shown. The logic block 502a generally comprises a fuse logic 602, CMOS passgates 604 and 606, and an 20 inverter 608. A plurality of CMOS passgates 604 and 606 may be implemented as a multiplexer. The fuse logic 602 generally comprises a transistor 650, a transistor 652, a fuse 654, an inverter 656 and an inverter 658. In one example, the fuse 654 may be implemented as a programming fuse. The programming fuse 654 may control the CMOS passgates 604 and 606 (depending on whether the fuse 654 is blown or not). When the programming fuse 654 is intact, the CMOS passgate 604 is generally enabled and hence X is presented to a next stage. When the programming fuse 654 is not intact, the CMOS passgate 606 is generally enabled and hence a complement of X (e.g., Xb) is presented to the next stage. The signal POR may be implemented to initialize a latch formed by the transistor 652 and the inverter 656 when the programming fuse 654 is not intact. When the fuse 654 is intact, the latch may powerup with an output of the inverter 656 being high, and there is generally no need for the signal POR.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The redundant row programming logic circuit 208 is generally kept independent of the regular row decoder 202 (which is associated with high fanout and large routing parasitics), to avoid slowdown in generating the signal DISABLE which may be implemented and to disable the word line driver 204 of the faulty row.

Figure 7:
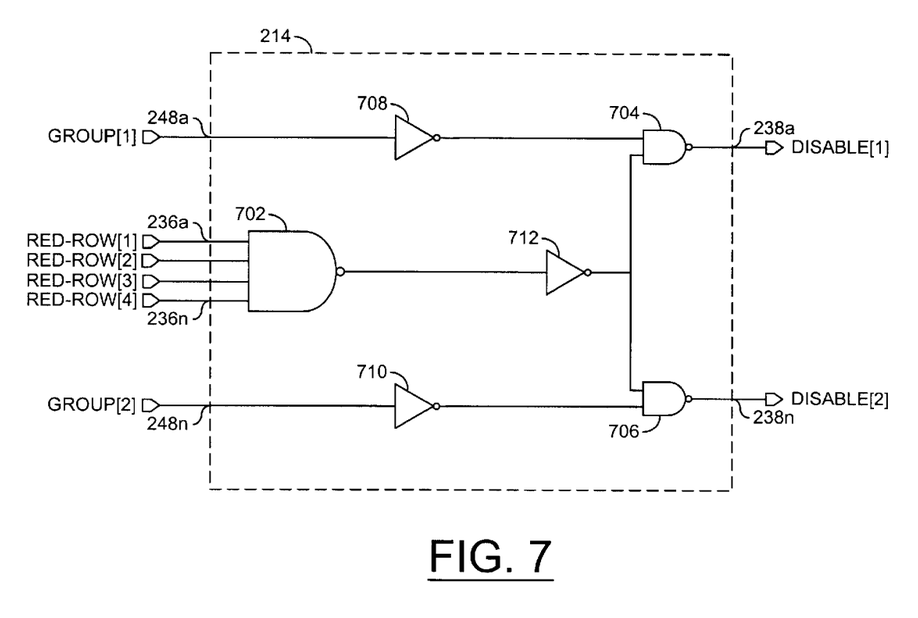
FIG. 7 is a block diagram of a disable logic block of FIG. 2.

Referring to FIG. 7, a schematic of the disable logic circuit 214 is shown. The input 236 may be m bits wide, where m corresponds to the number of physical redundant rows RED_ROW in the memory array 206. The input 248 may be y bits wide, where y corresponds to the number of groups GROUP in the memory array 206. Additionally, the output 238 may be y bits wide. The disable logic block 214 generally comprises a gate 702, a gate 704, a gate 706, an inverter 708, an inverter 710 and an inverter 712. The disable logic 214 of FIG. 7 may illustrate two groups (e.g., GROUP[1] and GROUP[2]) and four redundant rows (e.g., RED_ROW[1]–RED_ROW[4]). If any of the signals RED_ROW[1]–RED_ROW[4] is active (e.g., if any of the redundant rows are selected), the NAND gate 704 and the NAND gate 706 are disabled. For example, if the signal GROUP[1] is active the signal DISABLE[1] is generally not active, hence the word line driver block 204 is typically disabled. The faulty row is generally not enabled.

Figure 8:
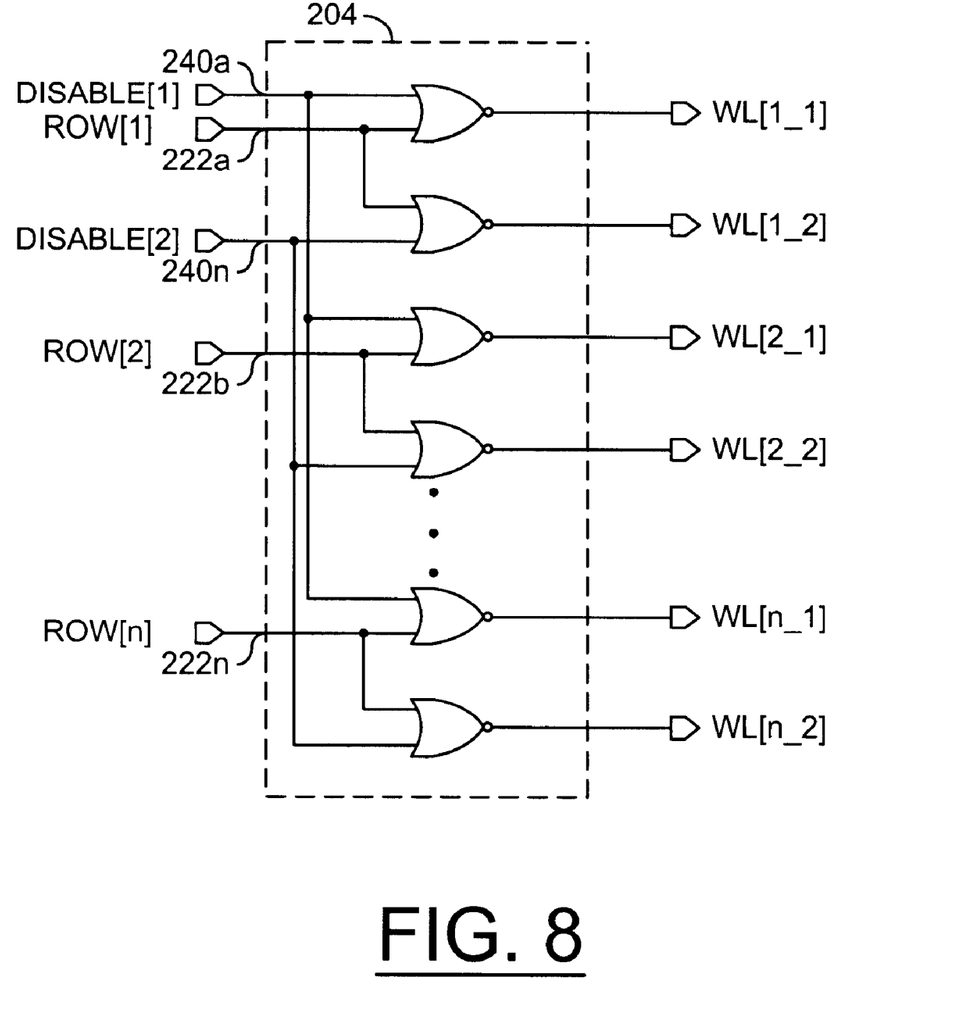
FIG. 8 is a block diagram of a word line driver of FIG. 2.

Referring to FIG. 8, a schematic of the word line driver 204 is shown. The input 222, may be $2^n$ bits wide, where $2^n$ is the number of physical rows in the memory array 206. The input 240 may be y bits wide, where y is the number of groups in the memory array. The output 224 may be y times $2^n$ bits wide, which corresponds to the number of logical rows in the memory array 206 excluding those corresponding to redundant rows. So the function of word line driver circuit 204 may be to divide a physical row into logical rows and enable one of them based on signal DISABLE. If the row address inputs ROW$_{13}$ADDR corresponds to the faulty row, the disable logic circuit 214 may deselect the signal DISABLE before the signal ROW goes active. The disable logic block 214 may prevent the faulty logical row from getting enabled even momentarily for a read or write operation. The word line driver 210 may be functionally identical to the word line driver 204. The word line driver 204 may illustrate a case of n physical rows and two groups.

The circuit 200 may implement a row redundancy scheme that occupies less silicon area by eliminating row disconnect fuses. A faulty row is generally disabled electrically (not physically by blowing a fuse). The circuit 200 may allow redundant row decoding to be implemented as fast as possible and may use the decoded signal (e.g., DISABLE) to disable the faulty row before the row is enabled. By implementing the decoding of redundant rows independently of the pre-decoders (not shown) of the regular rows and by tapping the signals directly from TTLs/registers (not shown), the circuit 200 may speed up redundant row decoding. The decoded signal DISABLE is generally implemented to disable the signal WL which typically gets gated in the furthest stage of the regular row decoding, to disable the faulty row. The signal WL of the faulty row is generally active, but the local wordline driver 204 is generally not.

For example, if the memory block has more memory arrays, the circuit 200 needs to be replicated for every additional memory array. If the memory array has no groups, the group decoder 212 may be dispensed with and the signal GROUP may be thought of as an always active signal.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a memory array having a plurality of memory cells arranged in a plurality of rows, wherein each cell is configured to read and write data;
   a first driver circuit configured to present a plurality of word line signals in response to (i) a decoded row signal and (ii) a disable signal;
   a second driver circuit configured to present one or more redundant word line signals in response to (i) one or more programmed redundant row signals and (ii) a decoded group signal; and
   a logic circuit configured to generate said disable signal in response to (i) said one or more programmed redundant row signals and (ii) said decoded group signal.

2. The circuit according to claim 1, further comprising:
   a decoder circuit configured to generate said decoded row signal in response to an address signal; and
   a programming logic circuit configured to generate said programmed redundant row signals in response to said address signal.

3. The circuit according to claim 2, wherein said programming logic circuit comprises:
   an address selection logic configured to program said redundant row signals to the desired address signal.

4. The circuit according to claim 2, further comprising:
   a second decoder circuit configured to generate said group signal in response to a second address signal.

5. The circuit according to claim 4, wherein said second decoder circuit comprises either a single or a multistage decoder.

6. The circuit according to claim 2, wherein said programming logic circuit comprises a plurality of address selection logic circuits configured to present either a true or a complement version of said address signal.

7. The circuit according to claim 6, wherein said address selection logic circuits comprise a fuse latch circuit and a first and second CMOS pass gate.

8. The circuit according to claim 2, wherein said decoder circuit comprises a single stage decoder.

9. The circuit according to claim 2, wherein said decoder circuit comprises a multi-stage decoder.

10. The circuit according to claim 1, wherein said memory cells are further configured to read and write data in response to either said word line signals or said one or more redundant word line signals.

11. The circuit according to claim 1, wherein said disable signal is asserted prior to assertion of said word lines and said redundant word lines.

12. The circuit according to claim 1, wherein said logic circuit is further configured to generate said disable signal in response to a logical combination of said one or more programmed redundant row signals.

13. The circuit according to claim 12, wherein said logical combination comprises a logical AND function.

14. A circuit comprising:

a memory array having a plurality of memory cells arranged in a plurality of rows, wherein each cell is configured to read and write data;

a first driver circuit configured to present one or more word line signals in response to (i) a first control signal and (ii) a disable signal;

a second driver circuit configured to present one or more redundant word line signals in response to (i) a second control signal and (ii) a third control signal; and a logic circuit configured to generate said disable signal in response to (i) said second control signal and (ii) said third control signal.

15. The circuit according to claim 14, wherein said first control signal comprises a decoded row signal.

16. The circuit according to claim 14, wherein said second control signal comprises one or more programmed redundant row signals.

17. The circuit according to claim 1, wherein said third control signal comprises a decoded group signal.

18. A method for disabling a row in a memory where each cell is configured to read and write data, comprising the steps of:

(A) generating a word line signal in response to a first control signal and a disable signal; and (B) generating the disable signal in response to (i) a second control signal and (ii) an address signal.

19. The method according to claim 18, further comprising a step of:

(C) programming one or more fuses for a particular row address.

20. The method according to claim 19, further comprising the step of:

(D) selecting a true or a complement state of an address signal in response to a state of said one or more fuses.

* * * * *